US006665208B2

(12) United States Patent
Ogura et al.

(10) Patent No.: US 6,665,208 B2
(45) Date of Patent: Dec. 16, 2003

(54) SEMICONDUCTOR INTEGRATED CIRCUIT DEVICE INCLUDING A CACHE HAVING A COMPARATOR AND A MEMORY

(75) Inventors: Kazutomo Ogura, Chitose (JP); Noriyoshi Watanabe, Chitose (JP); Kiyotada Funane, Chitose (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/095,030

(22) Filed: Mar. 12, 2002

(65) Prior Publication Data

US 2002/0126523 A1 Sep. 12, 2002

(30) Foreign Application Priority Data

Mar. 12, 2001 (JP) .......................... 2001-067942

(51) Int. Cl.[7] .............................. G11C 11/00
(52) U.S. Cl. ................... 365/154; 365/205; 365/189.07
(58) Field of Search ................. 365/154, 203, 365/205, 189.07, 190, 191, 189.01

(56) References Cited

U.S. PATENT DOCUMENTS 4,580,245 A * 4/1986 Ziegler et al. ............. 365/154

5,930,523 A  7/1999 Kawasaki et al.

FOREIGN PATENT DOCUMENTS

JP  7-334985   12/1995
JP  11-191291   7/1999

* cited by examiner

Primary Examiner—David Lam
(74) Attorney, Agent, or Firm—Antonelli, Terry, Stout & Kraus, LLP

(57) ABSTRACT

A signal to be written is transmitted to said pairs of writing signal lines in parallel with address input operation for the selection of a word line, information stored in the memory cell selected in response to the selection operation of said word line is transmitted to said pair of reading signal lines via said second selecting switch circuit so that it is amplified by said sense amplifier, and the amplified output of said sense amplifier is compared with the signal to be written on said pair of writing signal lines so that the signal to be written is written into said selected memory cell by selectively turning on said first selecting switch circuit in response to a result of said comparison.

9 Claims, 11 Drawing Sheets

SEMICONDUCTOR INTEGRATED CIRCUIT DEVICE INCLUDING A CACHE HAVING A COMPARATOR AND A MEMORY

BACKGROUND OF THE INVENTION

The present invention relates to a semiconductor integrated circuit device and in particular to a technology which is effective to use for semiconductor circuit devices including a tag memory in a cache memory.

The cache memory mainly comprises a cache tag (tag memory), cache data memory and cache controller. The cache tag stores therein part of the address which is also referred to as "address tag". The cache data memory stores therein data corresponding to the address tag which is stored in the cache tag. When part of the address stored in the cache tag matches the relevant address from a central processing unit, a hit signal is generated from the cache tag, so that data read from the cache data memory which is in parallel selected is accepted to the central processing unit. If a mishit occurs, a main memory will be accessed.

Some static memory cells are used as the cache tag. The static memory cells are disposed in static memory cells in a matrix configuration. The address tag which is read from the memory cells to complementary bit lines is amplified by a sense amplifier. The amplified output is compared with the input address to generate the hit or mishit signal. A processor using the static memory cells as a cache tag is disclosed U.S. Pat. No. 5,930,523 issued to S. Kawasaki et. al. Jul. 27, 1999.

SUMMARY OF THE INVENTION

In order to perform high speed operation in the above-mentioned cache tag, it is important to obtain a result of determination whether a hit or mishit occurs as fast as possible. Accordingly, the present inventors have studied the reading of address stored in the cache tag in one memory cycle, input of corresponding address from the central processing unit and its comparing operation.

It is an object of the present invention to provide a semiconductor integrated circuit device having storing and comparing circuit incorporated therein, which has achieved a high integration, low power consumption and speeding up.

It is another object of the present invention to provide a semiconductor integrated circuit device including a cache memory which has achieved high integration, low power consumption and speeding up.

The foregoing and other objects and novel features of the present invention will become more apparent from the description of the specification and annexed claims.

In an aspect of the present invention, a signal to be written is transmitted to said pairs of writing signal lines in parallel with address input operation for the selection of a word line which is connected to said memory cell, information stored in the memory cell selected in response to the selection operation of said word line is transmitted to said pair of reading signal lines via said second selecting switch circuit so that it is amplified by said sense amplifier, and the amplified output of said sense amplifier is compared with the signal to be written on said pair of writing signal lines so that the signal to be written which is transmitted to said pair of writing signal lines is written into said selected memory cell by selectively turning on said first selecting switch circuit in response to a result of said comparison.

Other objects, features and advantages of the invention will become apparent from the following description of the embodiments of the invention taken in conjunction with the accompanying drawings.

DESCRIPTION OF THE EMBODIMENTS

Figure 1:
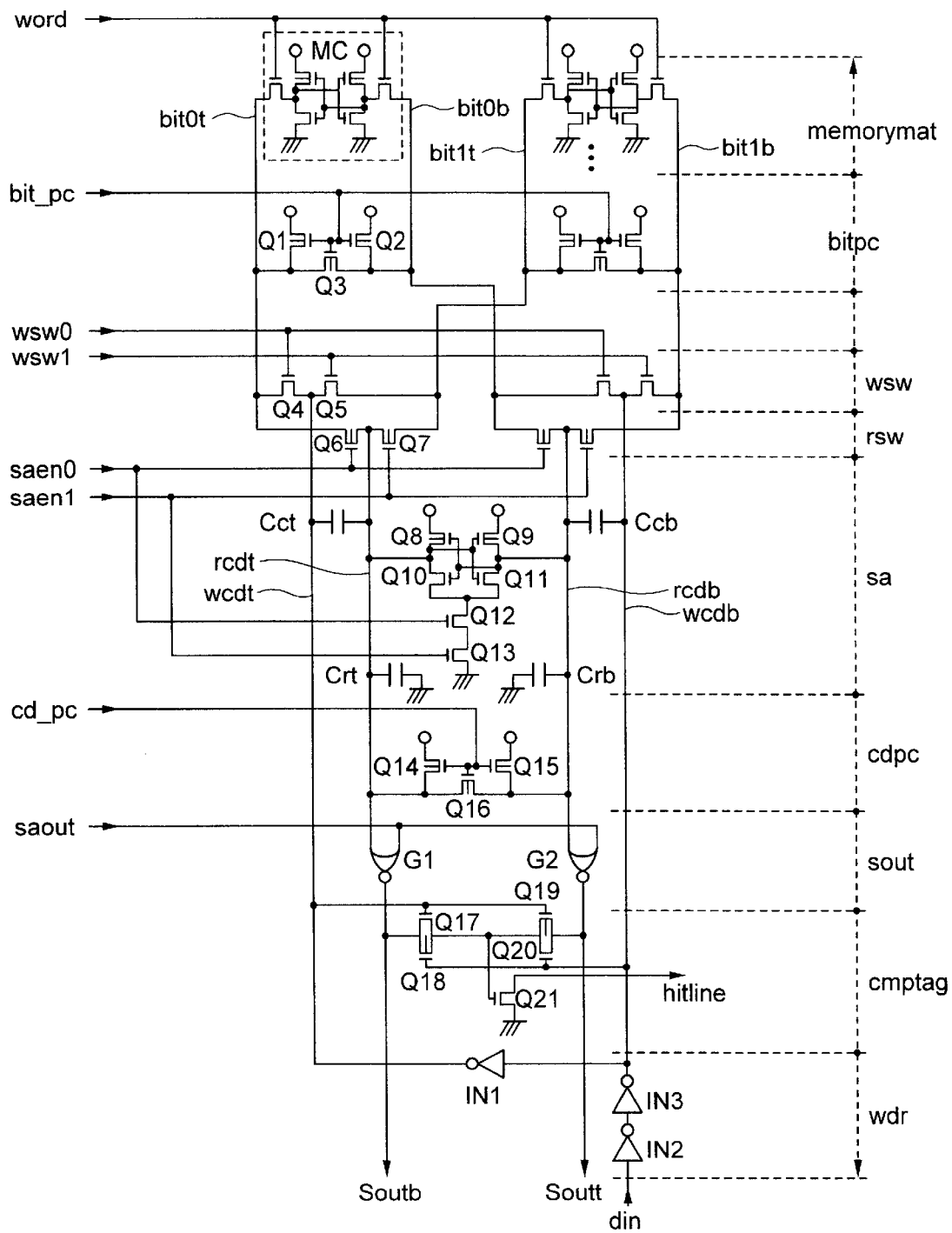
FIG. 1 is a circuit diagram of an address array in a cache memory in one embodiment of the present invention.

A circuit diagram showing an address array (or cache tag) in a cache memory in an embodiment of the present invention is shown in FIG. 1. In the drawing, two pairs of complementary bit lines, one word line, two memory cells which are provided at the intersections between the lines, its input/output select circuit, a sense amplifier and a comparing circuit are exemplarily shown. P type channel type MOSFETs are shown as discriminated from N channel type MOSFETs by adding the channels with lines pointing toward the gate electrodes.

A memory cell MC constitutes a latch circuit by cross-connecting the inputs and outputs of two CMOS inverter circuits comprising P and N channel type MOSFETs to each other. N channel type transmission gate MOSFETS are provided between a pair of input/output node of the latch circuit and a pair of complementary bit lines bit0$t$ and bit0$b$. The gates of the transmission gate MOSFETs are connected to the word line word. A memory cell between the other pair of complementary bit lines bit1$t$ and bit1$b$ also comprises CMOS static memory cells which are similar to above-mentioned memory cells.

A pair of complementary bit lines bit0$t$ and bit0$b$ are provided with P channel type precharging MOSFETs Q1, Q2, the gates of which are supplied with a precharge signal bit_pc. An equalizing P channel type MOSFET Q3 which receives the precharge signal bit_pc is provided between the pair of the complementary bit lines bit0$t$ and bit0$b$. Another pair of complementary bit lines bit1$t$ and bit1$b$ are provided with similar P channel type precharge MOSFETs and an equalizing MOSFET.

The bit lines bit0$t$ and bit1$t$ of the two pairs of complementary bit lines are connected to a reading data line rcdt via P channel type switch MOSFETs Q6 znd Q7. Other bit lines bit0$b$ and bit1$b$ of the two pairs of complementary bit lines are also connected to a reading data line rcdb via similar P channel type switch MOSFET. A sense amplifier is provided for the pair of complementary reading data lines rcdt and rcdb. Either one of the switch MOSFETs Q6 and Q7 is connected to the reading data line rcdt on activation of the sense amplifier when select signals saen0 and saen1 are supplied to the gates of the switch MOSFETs Q6 and Q7. Similarly, either one of the bit lines bit0b and bit1b are connected to a reading data line rcdb in response to the select signals saen 0 and saen 1.

The reading data lines rcdt and rcdb are connected to the input/output nodes of the sense amplifier including a CMOS latch circuit. The sense amplifier constitutes a latch circuit by cross-connecting the inputs and outputs of two inverter circuits comprising P channel type MOSFETs Q8 and Q9, and N channel type MOSFETs Q10 and Q11. An operation voltage is applied to the sources of the P channel type MOSFETs Q8 and Q9 and a ground potential of the circuit is applied to the sources of the N channel type MOSFETs Q10 and Q11 via N channel type switch MOSFETs Q12 and Q13. Sense amplifier operation signals saen0 and saen1 which are also used as said selected signals are supplied to the gates of the N channel type MOSFETs Q12 and Q13.

The reading data lines rcdt and rcdb which are the input/output nodes of the sense amplifier are provided with equalizing data lines rcdt and rcdb. Precharging P channel type MOSFETs Q14 and Q15 are provided between the reading data lines rcdt and rcdb and an operation voltage. A precharging signal cd_pc is supplied to the gates of the MOSFETs Q14 to Q16.

The sense amplifier in the embodiment includes a high sensitive latch circuit having a positive feedback. Accordingly, the precharging voltages to be supplied have their levels equalized by the equalizing MOSFET Q16 by the signals saen 0 and saen 1 before the initiation of the operation. When the potential difference between the reading data lines rcdt and rcdb has a given level which is determined by stored information from the selected memory cell, the voltages on the reading data lines rcdt and rcdb are amplified to high/low level voltages in response to the signals saen0 and saen1. At this time, isolation between the reading data lines rcdt and rcdb and the pair of selecting complementary bit lines bit0t and bit0b or bit1t and bit1b is performed in response to the high level of the signals saen0 and saen1. As a result of this, the load on the sense amplifier becomes only the reading data lines rcdt and rcdb, so that amplified signals at the high/low levels can be formed at a high rate.

Since the potentials on the reading data lines rcdt and rcdb become high/low levels corresponding to the operation voltage, so that a steady d.c. current flow can be eliminated in the CMOS latch circuit, reduction in power consumption can be achieved. The amplified output of the sense amplifier is fed to output signal lines soutb, soutt via NOR gate circuits G1 and G2, the gates of which are controlled by a timing signal sout.

The comparing circuit comprises two CMOS switches including P channel type MOSFETs Q17, Q19 and N channel type MOSFETs Q18, Q20; and an N channel type MOSFET Q20. The MOSFETs Q17, Q18 are connected in parallel to each other to form one CMOS switch while the MOSFETs Q19, Q20 are connected in parallel to each other to form another CMOS switch. The CMOS switches are at one end thereof with the output lines soutb and soutt and are commonly connected to each other at the other end thereof and are connected to the gate of the MOSFET Q21. The drain of the MOSFET Q21 is connected to a bit line bitline in common with the drain of the other similar MOSFET in a wired OR configuration. The source of the MOSFET Q21 is connected to the ground potential of the circuit.

The gates of the P channel type MOSFETs Q17 and Q19 of the two CMOS switches are connected to a writing data line wcdt while the gates of the N channel type MOSFETs Q18 and Q20 are connected to the writing data line wcdb. A write signal din is applied to the writing data line wcdb via inverter circuits IN2 and IN3. A signal on the writing data line wcdb is applied to the writing data line wcdt via an inverter circuit IN1.

If the signals to be written which are applied to the writing data lines wcdt and wcdb are in high/low levels and the output signals soutt and soutb output via the gate circuits G1 and G2 are in the same high/low level, the CMOS switch comprising the MOSFETs Q17 and Q18 are turned on in response to the high and low levels of the writing data lines wcdt and wcdb, respectively, so that the output amplified by the sense amplifier soutb which is in the low level is transmitted to the gate of the MOSFET Q21. This causes the MOSFET Q21 to turn on under the above-mentioned matching condition.

If the signals to be written which are applied to the writing data lines wcdt and wcdb are in low/high levels and the output signals soutt and soutb output via the gate circuits G1 and G2 are in the same low/high levels, the CMOS switch comprising the MOSFETs Q19 and Q20 are turned on in response to the low and high levels of the writing data lines wcdt and wcdb, respectively, so that the output amplified by the sense amplifier soutt which is in the low level is transmitted to the gate of the MOSFET Q21. This causes the MOSFET Q21 to turn off under the above-mentioned matching condition.

If the signals to be written which are applied to the writing data lines wcdt and wcdb are in high/low levels and the output signals soutt and soutb output via the gate circuits G1 and G2 are in the same low/high levels, the CMOS switch comprising the MOSFETs Q17 and Q18 are turned on in response to the high and low levels of the writing data lines wcdt and wcdb, respectively, so that the output amplified by the sense amplifier soutb which is in the high level is transmitted to the gate of the MOSFET Q21. This causes the MOSFET Q21 to turn on under the above-mentioned mismatching condition.

If the signals to be written which are applied to the writing data lines wcdt and wcdb are in low/high levels and the output signals soutt and soutb output via the gate circuits G1 and G2 are in the high/low levels, the CMOS switch comprising the MOSFETs Q19 and Q20 are turned on in response to the low and high levels of the writing data lines wcdt and wcdb, respectively, so that the output amplified by the sense amplifier soutt which is in the low level is transmitted to the gate of the MOSFET Q21. This causes the MOSFET Q21 to turn off under the above-mentioned mismatching condition.

Since the hit output line hitline is connected to the output of the other similar comparing circuit by a wired OR logic, the hit input line hitline keeps the high level which is precharged by a precharging circuit (not shown) which all data to be written or read data match and the hit output line is discharged to the low level by a MOSFET determining a mismatch, which is represented by the MOSFET Q21 when any one bit do not match the other bit.

The writing data lines wcdt and wcdb extend in parallel with the reading data lines rcdt and rcdb. The bit lines bit0t and bit1t of two pairs of complementary bit lines are connected to the writing data line wcdt via the N channel type switch MOSFETs Q4 and Q5. Other bit lines bit0b and bit1n of two pairs of complementary bit lines are also connected to the reading data line rcdb via similar N channel type switch MOSFET.

The pair of complementary writing data lines wcdt and wcdb are provided with a write amplifier comprising the inverter circuits IN2, IN3 and IN1. The data to be written is input to either one of the bit lines bit 0t and bit 0b, or bit 1t and bit 1b so that it is written into the selected memory cell by the supply of select signals wsw0 and wsw1 to the gates of the switch MOSFETs Q4 and Q5 when a result of comparison in the comparing circuit shows that any one bit mismatches.

Figure 2:
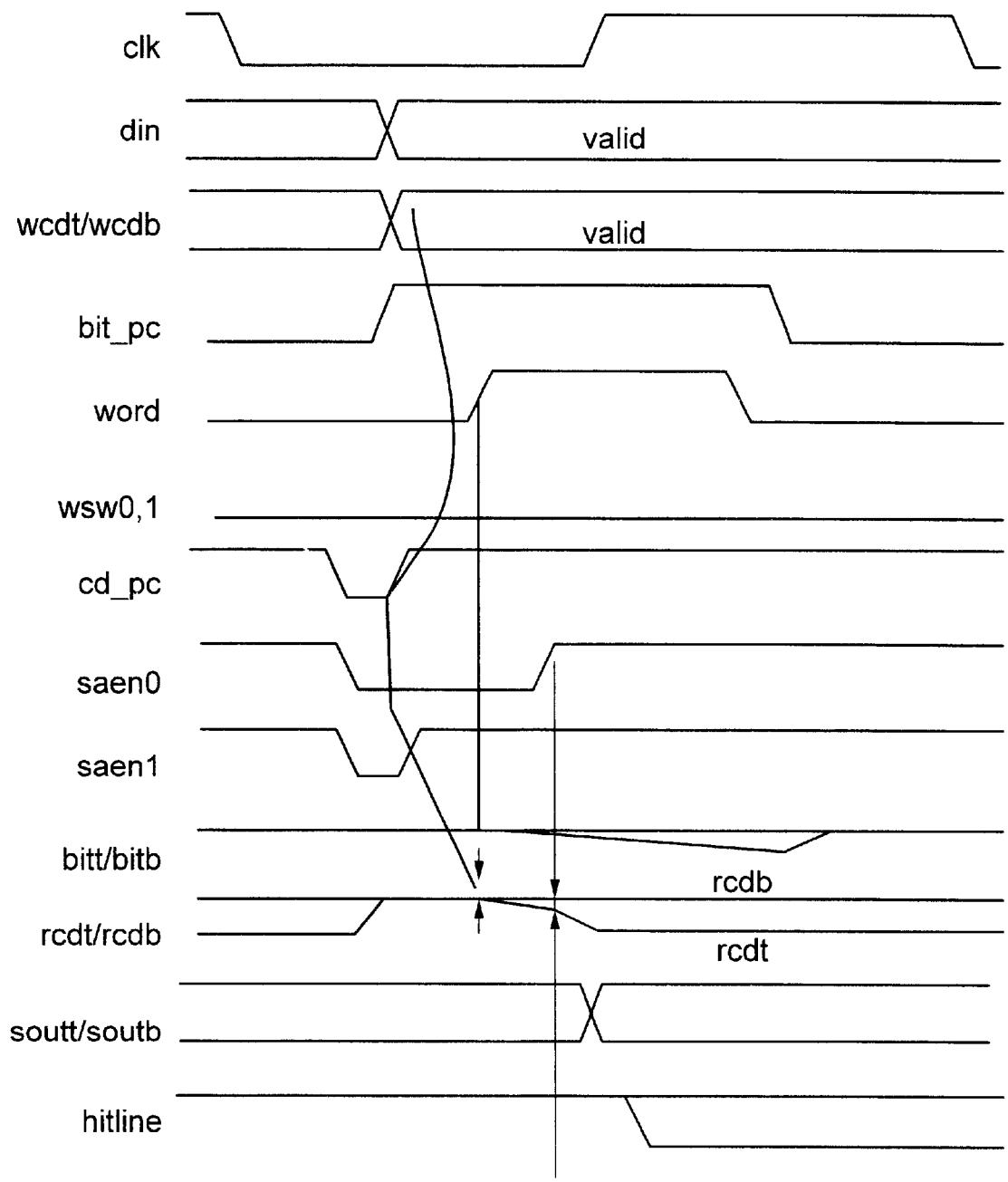
FIG. 2 is a timing chart explaining an exemplary operation of the address array shown in FIG. 1.

A timing chart explaining an example of the operation of the address array shown in FIG. 1 is illustrated in FIG. 2. Precharging and equalization of the reading data lines rcdt and rcdb is performed by bringing a control signal cd_pc into a low level in response to a low level of a clock signal clk. The signals saen0 and saen1 are brought into such a low level that the sense amplifier is brought into an inactive state and the pair of complementary bit lines bit0t, bit0b, bit1t and bit1b are connected to the reading data lines rcdt and rcdb. Precharging and equalization of the pair of complementary bit lines bit0t, bit0b and bit1t, bit1b is performed by bringing the signal bit_pc into a low level.

The control signals cd_pc and bit_pc are brought into a high level so that precharging and equalization of the reading data lines rcdt and rcdb and the pair of complementary bit lines bitt/bitb is completed. The signal saen1 corresponding to, for example, non-selecting pair of complementary bit lines bit1t, bit1b is brought into a high level so that the non-selecting pair of complementary bit lines bit1t, bit1b are isolated from the paire of reading data lines rcdt, rcdb. The write signal din is input to the writing data line wcdt/wcdb in response to the input of the write data (address signal).

Subsequently, the voltage level on the word line word becomes a high level which is a selection level, so that a read signal which depends upon the information signal depending upon the information stored in the selected memory cell is obtained on the complementary bit lines bitt/bitb and the reading data lines rcdt/rcdb which are connected thereto. When the voltage of the read signal which is obtained on the reading data lines rcdt/rcdb becomes a signal level which is necessary for the operation of the sense amplifier, the signal level becomes the high level to electrically isolate the complementary bit line bit0t/bit0b from the reading data line rcdt/rcdb and to turn on the MOSFET Q12 as well as the turning on of the MOSFET Q13 for activating the sense amplifier. This causes the load on the sense amplifier becomes only parasitic capacitance Crt and Crb of the reading data lines rcdt/rcdb. Accordingly, the micropotential difference between the reading data lines rcdt/rcdb quickly increases to high level/low level.

Such a read signal causes the comparing circuit to output the information stored in the memory cell since the gates of the gate circuits G1 and G2 are opened in response to a signal saout. Since at this time one of the CMOS switches is turned on for the write signal din which is one of the data to be compared in the comparing circuit, the MOSFET Q21 is turned on and off for the data match and mismatch, respectively. This causes the hit output line hitline to keep the high level for outputting a match signal or to change to the low level to output a mismatch signal. If the signals mismatch, the signal wsw0 is generated, so that write signals on writing data lines wcdt, wcdb are transmitted to the complementary bit lines bit0t, bit0b and are immediately written into the memory cell.

In this embodiment, precharging and equalization of the reading data lines rcdt, rcdb, inputting of write data and selection of word line is mainly performed in the first half cycle in which the clock signal clk is in the low level while activation and comparison of the sense amplifier, writing to the memory cell if needed, setting of the word line, and precharging and equalization of the pair of complementary bit lines bitt/bitb is performed in the latter half cycle in which the clock signal clk is in the high level.

Since reading from the memory cell, comparison of input data and obtaining of a result of the comparison can not only be conducted but also selective writing into the memory cell corresponding to the result of the comparison can be conducted in one cycle of the clock signal in such a manner, a determination whether data read from the selected cache data memory is to be accepted, or an access to the main memory is to be conducted in the central processing unit can be made faster by applying to the address array of the cache memory or cache tag, so that speeding up of data processing is achieved. Alternatively, the cycle of the clock signal clk can be shortened.

Figure 3:
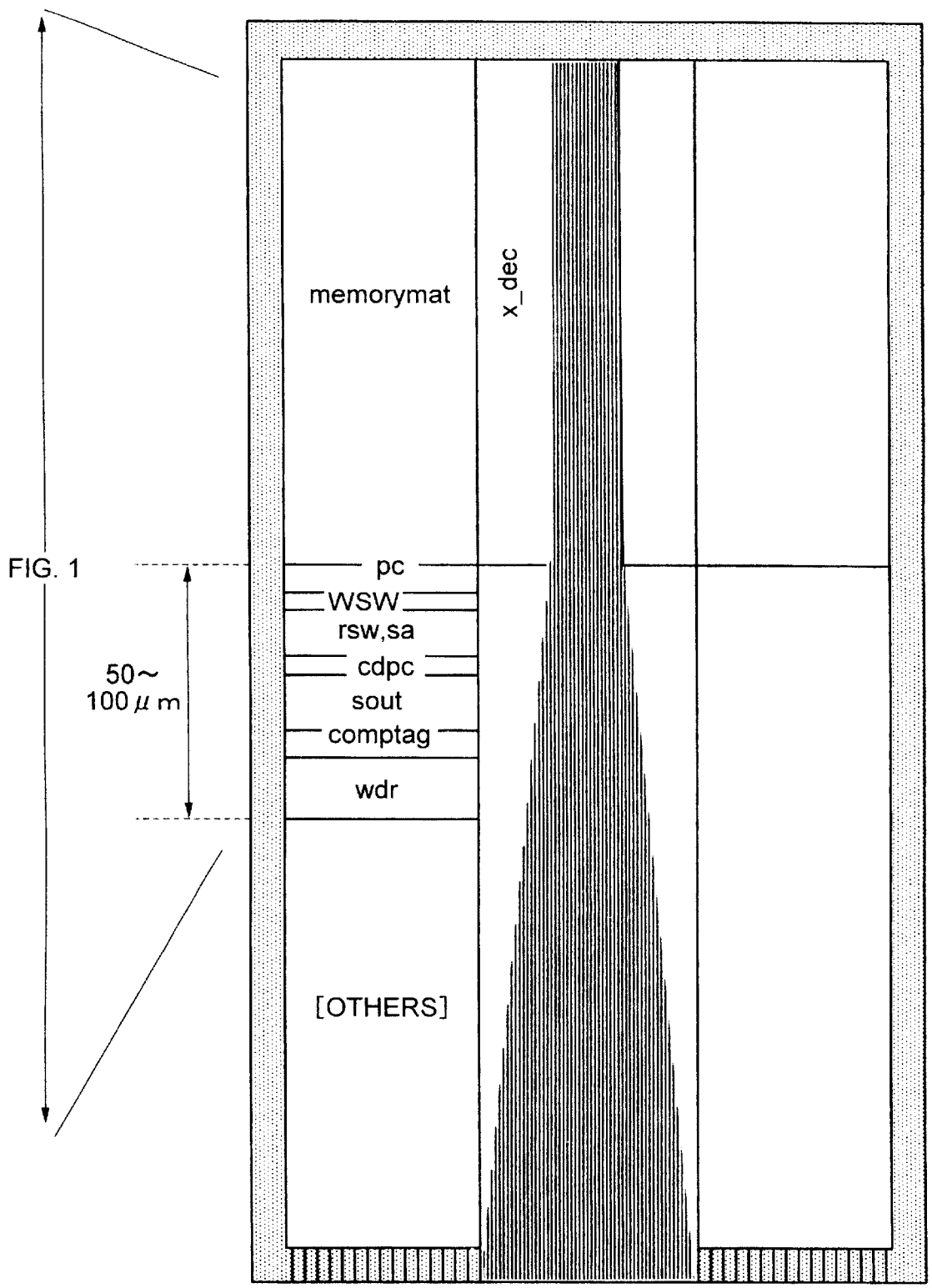
FIG. 3 is a schematic layout view of an exemplary address array shown in FIG. 1.

A schematic layout view of the address array in FIG. 1 is shown in FIG. 3. A memory mat memorymat comprises the memory cells MC which are disposed at the intersections between a plurality of word lines word and a plurality of pairs of complementary bit lines bitt/bitb in a matrix configuration. Two memory mats memorymat in both right and left sides of an X decoder circuit x_dec in an extending direction of the word lines word, that is a transverse direction as viewed in the drawing. The x decoder circuit x_dec receives an address signal or predecoded signal supplied from signal lines extending in a longitudinal direction to form a selection signal of the word line for the memory mat memorymat.

In a direction of extending of bit lines of the memory mat memorymat, a bit line precharging circuit PC comprising MOSFETs Q1 to Q3, etc. shown in FIG. 1, writing select circuit wsw comprising switch MOSFETs Q4, Q5, etc., reading select circuit rsw comprising switch MOSFETs Q6, Q7, etc., sense amplifier sa comprising MOSFETs Q8 through Q13, reading data line precharging circuit cdpc comprising MOSFETs Q14 through Q16, etc., sense amplifier output circuit sout comprising gate circuits G1, G2, comparing circuit cmptagj comprising MOSFETs Q17 through Q21, and writing amplifier wdr comprising inverter IN1 to IN3 are disposed in a cascade manner. Each of these circuits has a length which is about 50 to 100 $\mu$m in a direction of extending of bit lines of the memory mat memorymat.

Figure 4:
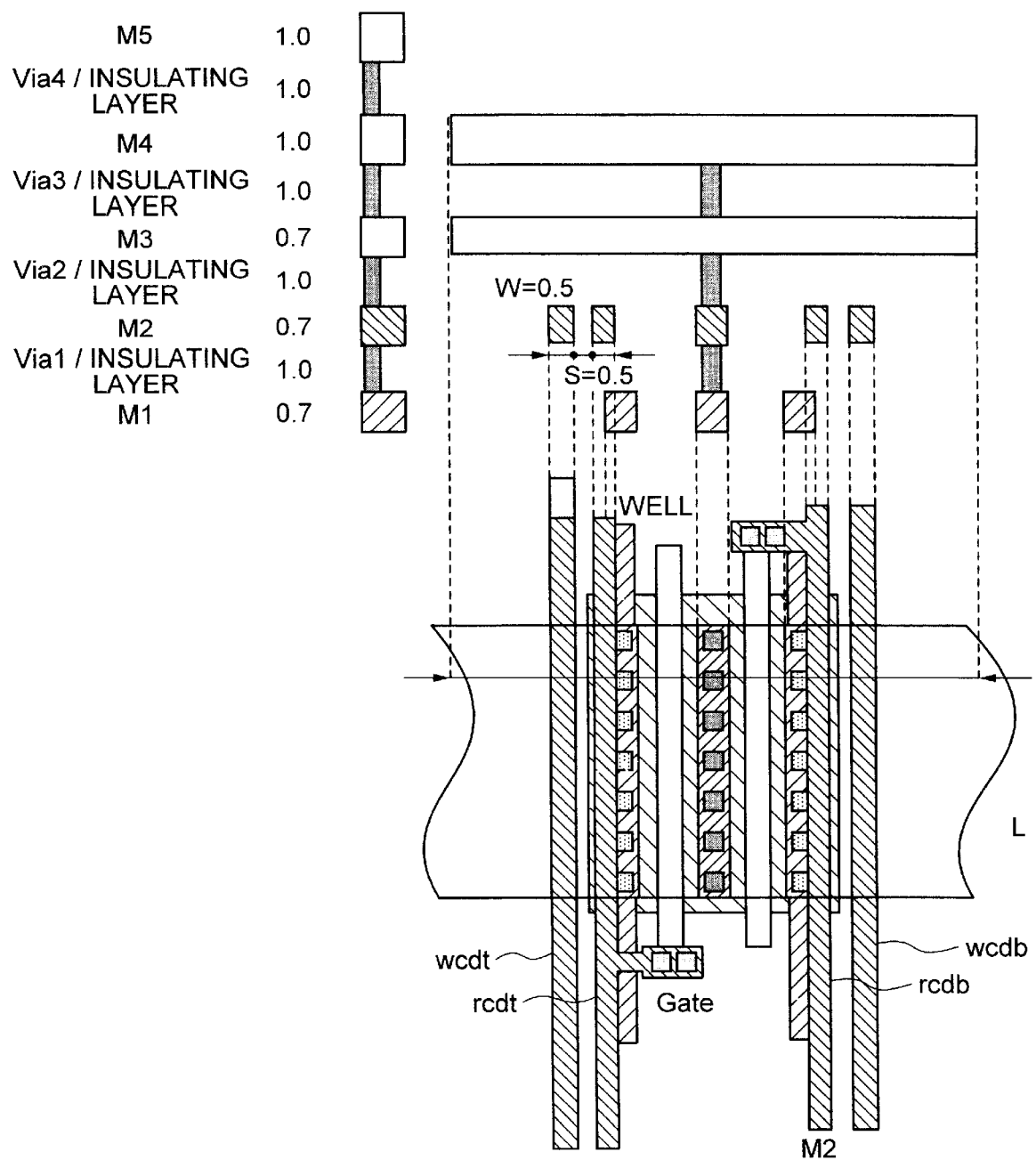
FIG. 4 is an element configuration view showing an example of part of the sense amplifier in FIG. 1.

A schematic view of the elements of part of the sense amplifier is shown in FIG. 4. A relation between the element layout in which P channel MOSFETs Q8 and Q9 forming a sense amplifier sa are formed and the wiring pattern which is related thereto is exemplarily shown in the drawing. A reference "L" denotes P type diffused layers which are formed in a "N" type well WELL, constituting source, drain diffusion layers of the MOSFETs Q8, Q9. A gate Gate which forms MOSFETs Q8, Q9 extends in a longitudinal direction so that it straddles the diffusion layers L.

The diffusion layer between the above-mentioned two gates constitutes a common source of the MOSFETs Q8 and Q9 and is connected to a metallic wiring layer M1 at a first level via a contact portion, to a metallic wiring layer M3 at a third level via a metallic wiring layer M2 at a second level and to power source wiring comprising a metallic wiring layer M4 at a fourth level. In the present embodiment, reduction in noise which is generated in power lines on operation of the sense amplifier is achieved by forming the power wiring using two wiring layers M3, M4 at the third and fourth levels in order to reduce the impedance of the power lines.

The gate of the P channel type MOSFET Q9 is connected in the lower side thereof to the reading data line rcdt extending in a longitudinal direction in parallel therewith. The gate of the P channel type MOSFET Q8 is connected in the lower side thereof to the reading data line rcdb extending in a longitudinal direction in parallel therewith. The reading data lines rcdt and cdb are formed using the metallic wiring layer M1 at the first level. The drains of the MOSFETs Q8 and Q9 are cross-connected to the gates of the MOSFETs each other in the positions (not shown) by the metallic wiring layer M1 at the first level so that they are in the form of latch.

Writing data lines wcdt and wcdb are disposed externally of the reading data lines rdct/rdcb. In other words, the writing data line wcdt is disposed in parallel with and in the left side of the reading data line rdct and the writing data line wcdb is disposed in parallel with and in the right side of the reading data line rdcb. Circuit components comprising the MOSFETs Q4 through Q21 and inverter circuits IN1 to IN3 are disposed so that the writing data line wcdt and wcdb have an maximum width.

The memory mat memorymat is provided with two pairs of complementary bit lines bit0t/bit0b and bit1t/bit1b shown in FIG. 1 so that the bit lines occupies the width of the wiring data lines wcdt and wcdb. The memory cell MC is adapted to mainly perform the storing operation. An element which is small in size is used for providing a large storage capacity at a small area. Since MOSFETs which form sense amplifier, etc. are adapted to perform a high rate amplifying operation at a high sensitivity in contrast to this, they are relatively large in size. Therefore, these circuits can be aligned to each other and be formed at a high density without wasting the area by allocating two pairs of complementary bit lines bit0t/bit0b and bit1t/bit1b to the repeating pattern of circuits to which one sense amplifier and writing and reading data lines are allocated as mentioned above.

Figure 5:
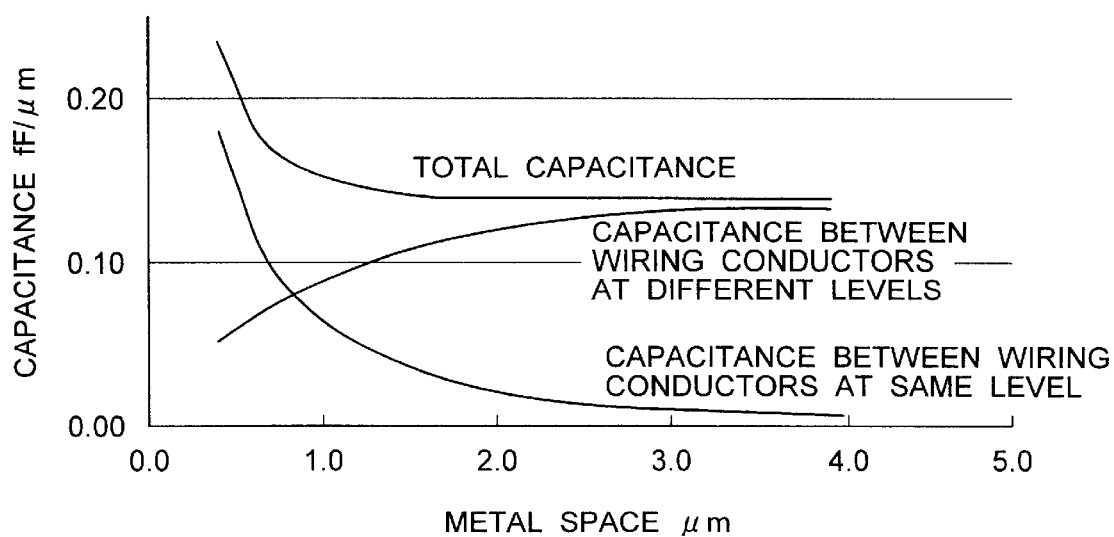
FIG. 5 is a graph showing the parasitic capacitance which occurs between wiring conductors.

Numerals which are annexed to the wiring layers M1 to M5 and interlayer insulating layers in FIG. 4 represent their exemplary thicknesses. The wiring width W and wiring space S exemplarily denote minimum thickness of the wiring layer M2 at the second level, which can be produced at the second level. In case in which wirings are disposed at a high density in such a manner, parasitic capacity would occur between the wiring conductors as shown in FIG. 5. Parasitic capacitances Cct and Ccb may occur between the writing data lines rcdt and wcdt; and rcdb and wcdb adjacently extending in parallel with each other by a distance about 50 to 100 μm in FIG. 1.

The microprocessor and the like having a cache memory incorporated therein should be powered by batteries particularly when it is used for portable electronic devices. Accordingly, it is important to reduce power consumption of the memory to extend the service life of the batteries. It is also important to lower the minimum active voltage as low as possible. It has been found that malfunction may occur at low voltages if the circuit is to operate at a voltage which is as low as about 1.2 to 1.6 volts. Study of the causes of the malfunction in detail shows that it may occur due to interference of signals caused by the above-mentioned parasitic capacitances Ct, Ccb.

In other words, the reading data lines rcdt/rcdb which are the micropotential difference input signal line of the sense amplifier which amplifies the micro-potential difference in the memory cells is in a floating state before the starting of sensing and after the completion of the precharging. If a read request data which is also the data to be written is input to the writing data lines wcdt/wcdb at a full amplitude, an electrical interference between the parasitic capacitances Cct and Ccb may cause a potential which is reverse to the normal potential difference corresponding to information stored in the memory cell, selected from the data lines. This potential is amplified by the sense amplifier at time t1 without being processed, resulting in a malfunction.

As mentioned above, the sense amplifier comprises a CMOS latch circuit, the amplifying operation of which is controlled in response to a timing signal for reducing the power consumption. Since the CMOS latch circuit amplifies a signal at a high sensitivity by positive feedback action, a signal having a high amplitude, which is as high as the CMOS level can be obtained and a d.c. current will not flow due to an increase in the amplitude of the signal. Accordingly, reduction in power consumption can be achieved. Since the necessity of a level converting circuit which converts a low amplitude signal in the differential circuit into a higher amplitude signal in comparison with a static type sense amplifier using a differential circuit through which a bias current steadily flows will be omitted, simplification of circuit and remarkable reduction in current consumption can be achieved.

Since it might be impossible to recover levels of data lines by its positive feedback loop if the sense amplifier is activated by a state in which the amplitude of the input signal is insufficient or a wrong input signal, control of its activation timing is important. Accordingly, it suffices to delay the activation of the sense amplifier by the time when the potential difference corresponding to information stored in the memory cell appears on the reading data line pair rcdt/rcdb by delaying the timing t1 of the sense amplifier activation. This makes the operation speed slower. Alternatively, the input of data to be written is only required to delay. This also makes the operation speed slower.

Figure 6:
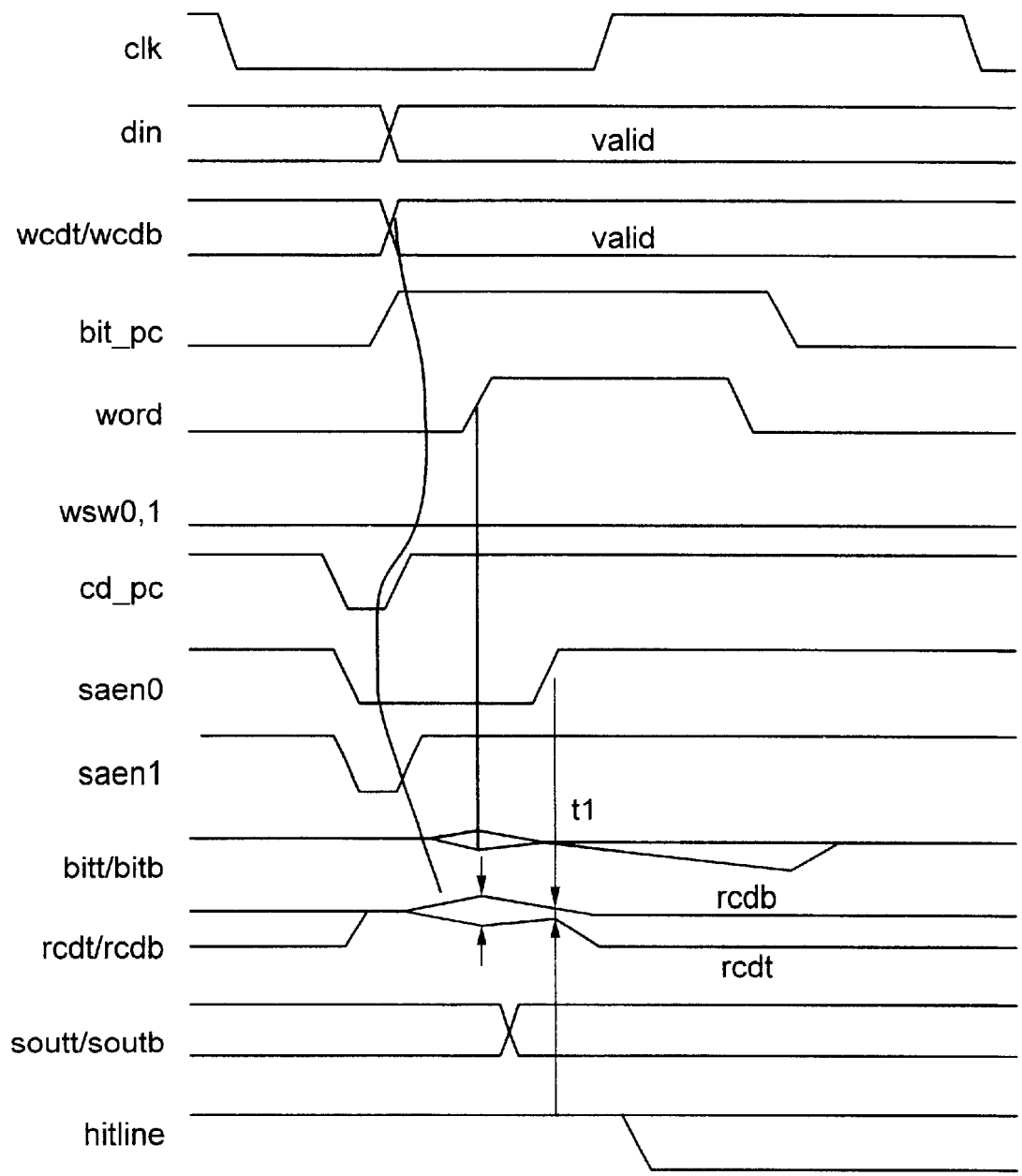
FIG. 6 is a timing chart showing an exemplary operation of the address array when interference of the parasitic capacitance is considered.
Figure 7:
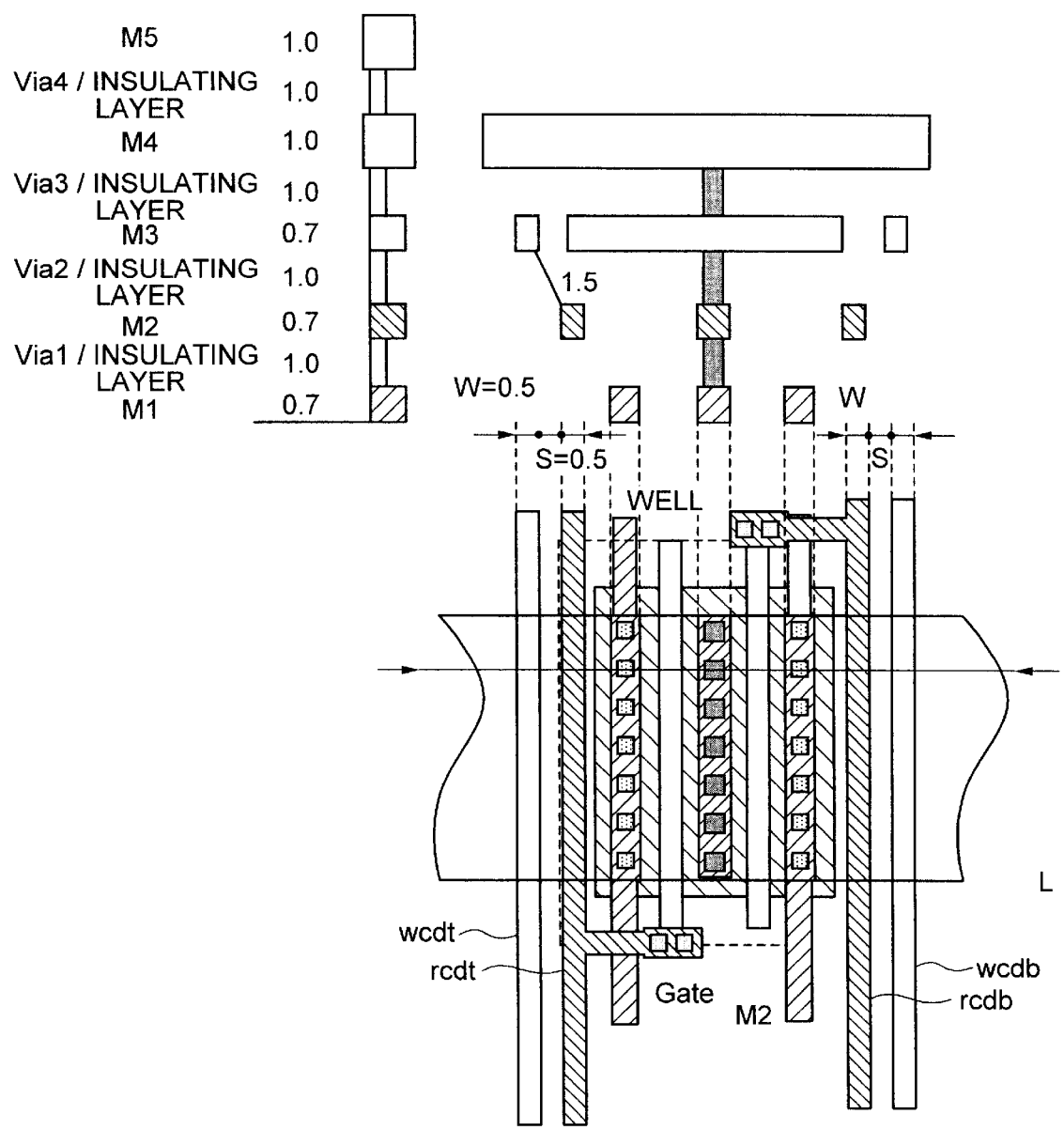
FIG. 7 is an element configuration view showing another example of part of the sense amplifier in FIG. 1.

Other example of element configuration of part of the sense amplifier is shown in FIG. 7. This embodiment is an modification of the embodiment of FIG. 4 for providing a circuit having a higher density and a lower operation voltage. The writing data lines wcdt/wcdb are formed of the metallic wiring conductor M3 at the third level. This makes it possible to increase the distance between the adjacent wiring conductors to about 1.5 μm even if the wiring conductors are formed in accordance with the same rule as the embodiment of FIG. 4. Since this enables remarkable reduction in the capacitances of the parasitic capacitors Cct and Ccd, the noise which is picked up on the reading data lines rcdt/rcdb which are in the floating state before the initiation of sensing as shown in FIG. 6 can be reduced to as low as negligible. The other configuration is similar to that of the embodiment of FIG. 4.

The pitch of the metallic wiring conductor M2 at the second level may be made larger by switching the writing data lines wcdt/wcdb to the metallic wiring conductor M3 at the third level like this embodiment. This provides an advantage in that connection with circuit elements which constitutes a sense amplifier and precharging circuit which is connected to the reading data lines rcdt, rcdb becomes easy. A combination in which the reading data lines rcdt/rcdb and the writing data lines wcdt/wcdb are formed at different wiring layer levels can be implemented by various combinations in which the reading data line rcdt/rcdb and the writing data lines are formed of M3 and M2, respectively or alternatively the reading data lines rcdt/rcdb and writing data lines are formed of M2 and M1, respectively.

Figure 8:
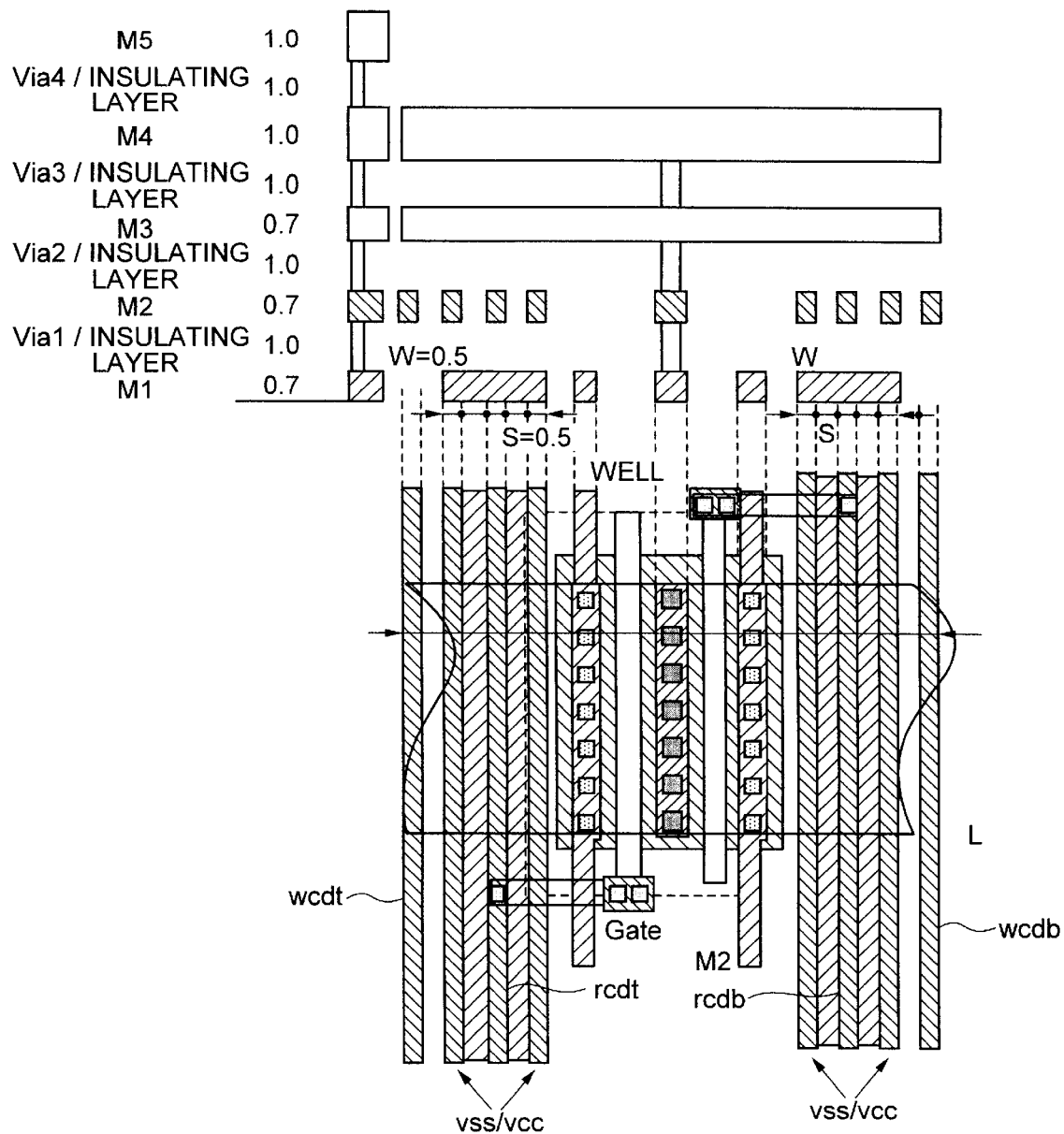
FIG. 8 is an element configuration view showing other example of part of the sense amplifier in FIG. 1.

Other example of element configuration of part of the sense amplifier sa is shown in FIG. 8. This embodiment is also a modification of the embodiment of FIG. 4 for similarly providing a circuit having a higher density and a lower operation voltage. A shielding wiring conductor to which a ground potential VSS of the circuit is applied is provided between the adjacent lines of the reading data lines rcdt/rcdb and the writing data lines wcdt/wcdb. Although not particularly restricted, a shielding wiring conductor to which a power source voltage VCC is applied is also provided between the reading data lines rcdt and rcdb.

If the distances between the adjacent wiring conductors are determined in accordance with the same rule as that of the embodiment of FIG. 4, the wiring conductors are disposed at a high density so that the distances therebetween are about 0.5 $\mu$m. Since shielding wiring conductors are provided between the wiring conductors rcdt and wcdt; and rcdb and wcdb, the capacitances between said parasitic capacitors Cct and Ccd can be made substantially zero. This disables the reading data lines rcdt/rcdb which are in the floating state before the starting of sensing as shown in FIG. 6 to pick up noise from the writing data lines wcdt/wcsb. The other configuration is identical with that in the embodiment of FIG. 4.

Figure 9:
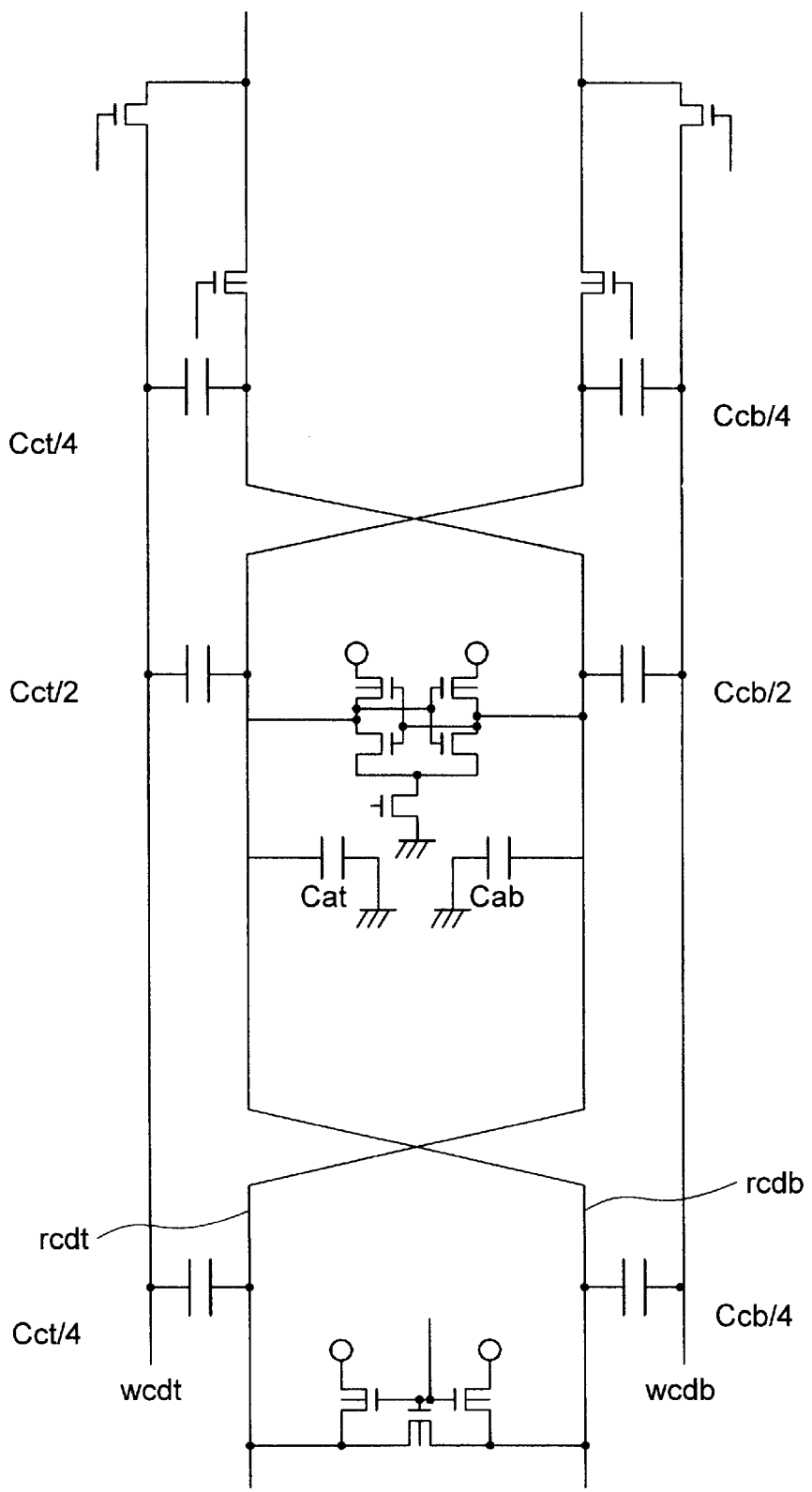
FIG. 9 is a circuit diagram showing another example of writing and reading data lines in FIG. 1.

Other circuit diagram of the writing and reading data lines is shown in FIG. 9. This embodiment is also a modification of the embodiment of FIG. 4 for providing a circuit having a higher density and lower voltage. The circuit is modified so that the interference upon the reading data lines rcdt/rcdb from the writing data line wcdt/wcdb is cancelled. In the embodiment, parasitic capacitance is given to both the writing data lines wcdt and wcdb by crossing the reading data lines rcdt and rcdb which are provided inside.

The total length of the writing data lines wcdt and wcdb which extend in parallel with the reading data lines rcdt and rcdb is equally divided by 4. The reading data lines rcdt and rcdb are crossed in a position of a quarter of the total length and are crossed again in a position of three quarters of the total length. This enables the reading data line rcdt to have a parasitic capacity of Cct/4+Cct/4 for the writing data line wcdt and a parasitic capacity of Ccb/2 for the writing data line wcdb. The other reading data line rcdb has a parasitic capacitance of Cct/2 for the reading data line wcdt and a parasitic capacitance of Ccb/4+Ccd/4 for the writing data line wcdb.

Then the following relations are established:

$$Cct/4+Cct/4=Ccb/2$$

$$Cct/2=Ccb/4+Ccd/4$$

Halves of data to be written having a full amplitude which are provided to the writing data lines wcdt and wcdb will provide the reading data lines rcdt and rcdb with the same interferences having reverse phases so that the interferences are cancelled. Since the reading data lines rcdt and rcdb can be kept the same before sensing by this without decreasing the above-mentioned shielding line and the parasitic capacitances Cct and Ccd, stable reading operation can be performed.

Foregoing embodiment of FIG. 9 may be combined with that of FIG. 7. In other words, stabilization of the reading data lines rcdt/rcdb can be achieved by cancelling small interference due to the parasitic capacitance which is made small like in the embodiment of FIG. 7, with the embodiment of FIG. 9.

Even if the pitches between the metallic wiring conductors become unexpectedly narrower for speeding up of access time and manufacturing process, enough distances between the metallic wiring conductors can be assured in the embodiment of FIG. 7. Normal reading operation in memory circuit is made possible. In the embodiments of FIGS. 8 and 9, constant characteristics can be assured without depending upon the technical level of designers, resulting in easy design conditions and reduction in the number of steps in manufacturing process.

Figure 10:
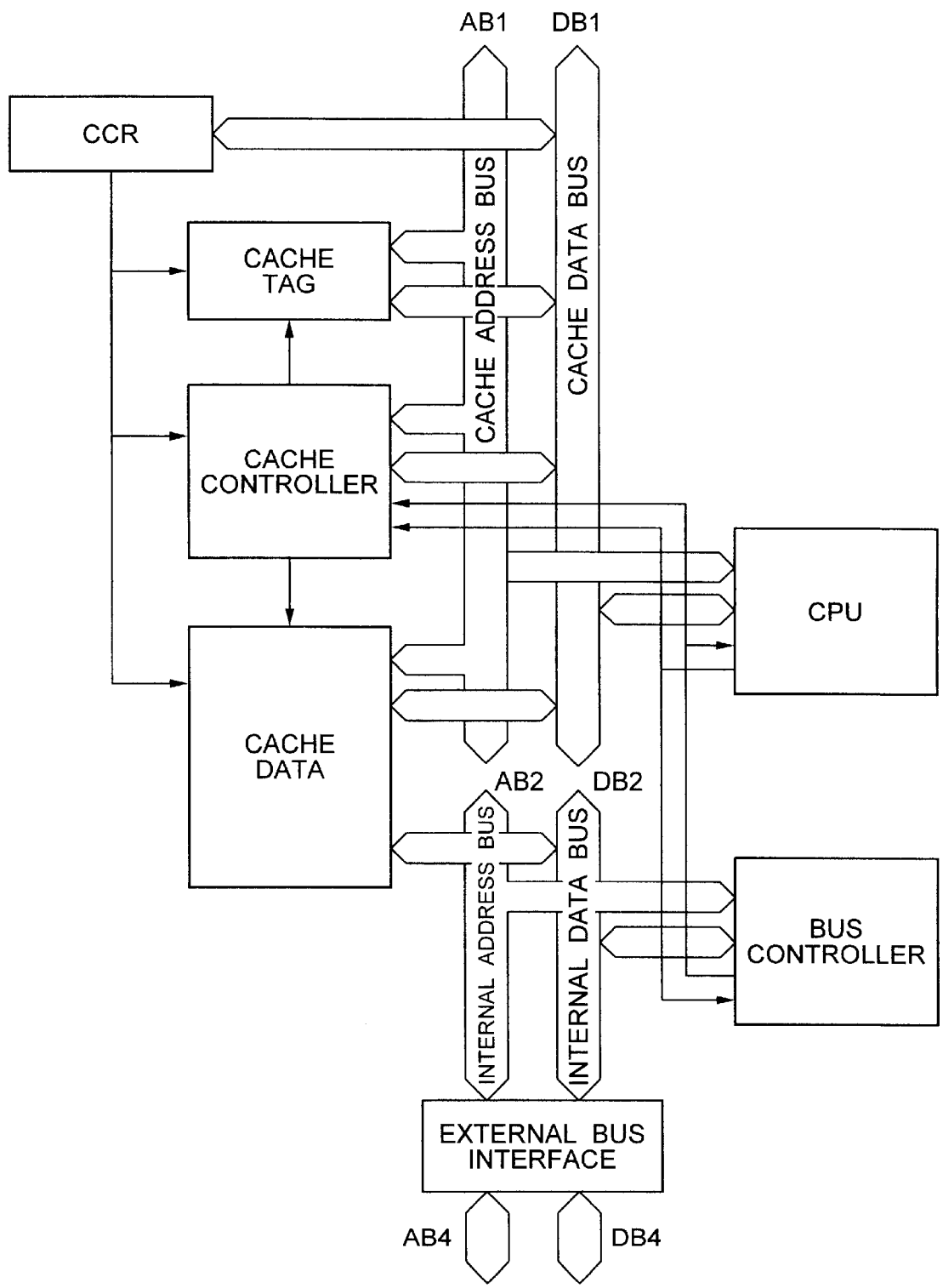
FIG. 10 is a circuit diagram showing a single-chip microcomputer having a cache memory incorporated thereon in one example of the present invention.

A block diagram showing one example of a single chip microcomputer having a cache memory mounted thereon in one embodiment of the present invention is shown in FIG. 10. The cache memory in the embodiment executes the output of relevant data from an address input in one cycle. Although an algorithm for replacing data is not particularly limited, Least Recently Used (LRU) process is used.

The cache memory mainly comprises a cache tag (address array), cache data (data array) and cache controller. The cache tag stores therein part of address, which is referred to as "address tag". Data which corresponds to the address tag stored in the cache tag is stored in the cache data.

When part of the address which is stored in the cache tag matches the relevant address from the central processor unit CPU, a hit signal is output from the cache tag, so that the data which is in parallel read from the selected cache data is accepted to the central processing unit. If a mishit occurs, an external main memory would be accessed via a break control UBC and an external bus interface.

The cache control register CCR has control bits for cache enable, instruction fill prohibit, data fill prohibit, way specify, etc. and is used for presetting the operation modes.

Brief concept of the operation of the cache memory in one embodiment of the present invention is as follows: For example, an address signal comprises 32 bits A31 to A0. Sixteen bytes corresponding to 4 bits of the addresses A3 to A0 constitute one line. The line is a set of data which is associated with an associative address. Nineteen-bit address signals A28 to A10 are written in the cache tag as a tag address. Three bits of the address signals A31 to A29 is used for specifying the access space.

LRU information is provided corresponding to 64 entries comprising 0 to 63. LRU information comprises 6 bits. Information relating to past access which was used for determination of LRU replacement is represented by 6 bits. The number of combinations which can be represented by 6 bits is 64. Twenty-six combinations are used in which initial value is 0. Least significant bits are combined so that they are used when they are used as 2 ways. In other words, if the least significant bit of the bits which are used for replacement due to mishit is zero when 2 ways of 4 ways are used as incorporated RAM, then way 3 is used. If the bit is 1, then way 2 is used. Rewriting of LRU information is performed in 4-way mode by 24 combinations which satisfy the above-mentioned conditions.

When the tag address read from the cache tag matches 19-bit address signal comprising A28 to A10 output from the central processing unit CPU and the valid bit V is 1, a hit signal is output and 16 byte data is read from the cache data. 4 bytes of 16 bytes (32 bits) are specified by the addresses of 2 bits and are read out to the central processing unit CPU.

Figure 11:
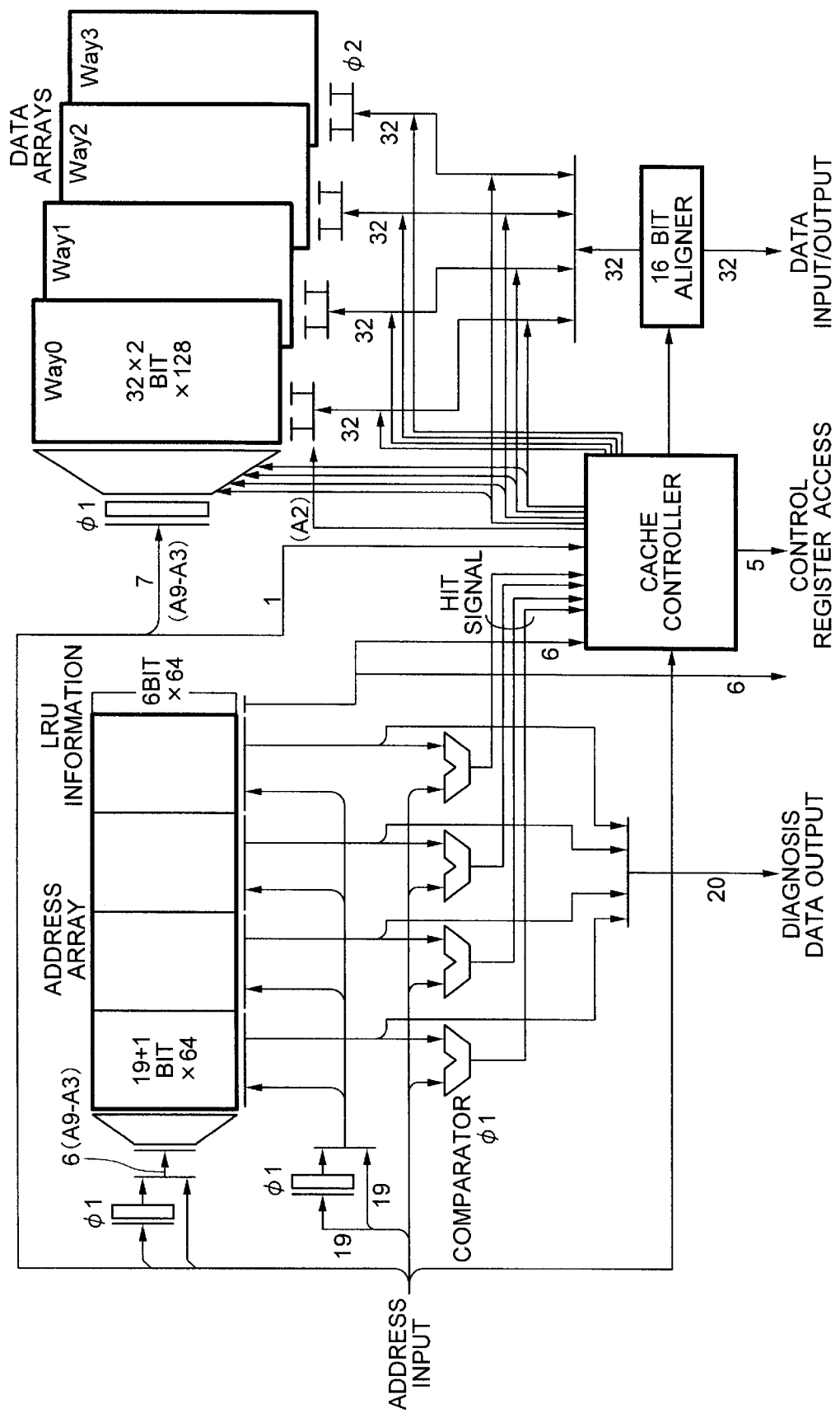
FIG. 11 is a block diagram showing an example of a cache memory in one embodiment of the present invention.

A block diagram showing an example of a cache memory in one embodiment of the present invention is shown in FIG. 11. The cache tag comprises a decoder, address arrays and a compiler. There are provided 4 address arrays corresponding to 4 ways as mentioned above. An address of A9 to A4 is input thereto so that one of 64 entries is selected. Each entry stores 19 bits corresponding to the address tag, address signal and one-bit valid bit. Accordingly, the address array corresponding to one way is made as (19+1)×64. 6×64 storage units of LRU information are commonly provided corresponding to 4 ways.

Since the latch circuit for holding an address signal in response to a pulse φ1 has the central processing unit CPU which outputs an address signal by the pipeline operation, it is used for storing the address when mishit occurs. The address tag read from the address array and corresponding 19 bit address signal A28 to A10 of the address input are input to a comparator. The comparator comprises MOSFETs Q17 to Q21 in FIG. 1.

The hit signals of four comparators which are provided for four ways are supplied to the cache controller. The LRU information corresponding to the selected one of 64 entries is supplied to the cache controller. One way which is used for the replacement if no hit signal is output from 4 ways is determined by the LRU information. The address tag which has been read from the address array is output as diagnosis data by the selector.

Seven-bit address signal comprising address signals A9 to A3 of the address input is input to the decoder of the data array. The data array comprises 32 bits×2×128. The address signals A9 to A4 correspond to said 64 entries. The address signal A3 selects high order 32×25 bit data or lower order 32×2-bit data. The number of the complementary data lines is decreased to simplify the output of data in unit comprising 32 bits by making the configuration of the data array in an elongated manner.

Although not particularly restricted, the hit signal is input to the decoder of the data array from the cache controller in this embodiment. This performs the selection operation of the word line for only the way corresponding to the hit signal among 4 ways in the decoder, so that low power consumption is achieved. Additionally, the hit signal may be used for only the control of the sense amplifier. In other words, the decoder of the data array may bring the word lines of 4 ways into the selective state for fast reading to advance the reading operation from the memory cell and to activate the sense amplifier after the hit signal, so that the reading from the data array is made fast. The 32×2-bit data read from the way corresponding to the hit signal is output via the selector which is selected by the address signal A2 output via the cache controller.

The comparator of the address tag is operated in response to a timing signal φ1. In other words, a signal sout for controlling the gate circuits G1 and G2 of FIG. 1 is generated in response to the timing signal φ1. In contrast to this, the output selector of the data array is operated in response to the timing signal φ2 which is delayed by half cycle relative to the timing signal. Accordingly, no problem will occur even if selection of word line of the data array and control of the sense amplifier is performed in response to the hit signal. An aligner at an output unit is used when data is output in unit of 8 bits or 16 bits depending upon the output data width.

Effects and advantages which are provided by the above-mentioned embodiments are as follows:

(1) A signal to be written is transmitted to said pairs of writing signal lines in parallel with address input operation for the selection of a word line which is connected to said memory cell, information stored in the memory cell selected in response to the selection operation of said word line is transmitted to said pair of reading signal lines via said second selecting switch circuit so that it is amplified by said sense amplifier, and the amplified output of said sense amplifier is compared with the signal to be written on said pair of writing signal lines so that the signal to be written which is transmitted to said pair of writing signal lines is written into said selected memory cell by selectively turning on said first selecting switch circuit in response to a result of said comparison. This provides an effect that speeding up can be achieved.

(2) Furthermore, two pairs of complementary bit lines are allocated to one pair of complementary reading signal lines and a pair of complementary writing signal lines, said two second selecting switch circuits corresponding to said two pairs of complementary bit lines are configured so that one of said second select switch circuits corresponding to the non-selecting pair of the complementary bit lines before said word lines are selected is turned off and the other second select switch circuit corresponding to the selecting pair of complementary bit lines is turned on, and said sense amplifier is activated and the other second selecting switch circuit which has been turned on is turned off after information stored in the memory cell corresponding to the selecting pair of the complementary bit lines is read to the pair of reading signal lines via the other select switch circuit by the select operation of said word lines. This provides an effect that speeding up of the sense amplifier can be achieved.

(3) Furthermore, a plurality of said sense amplifiers and a plurality of said comparing circuits are provided and when any one of the output signals of the plurality of comparing circuits do not match, said first select switch circuit is turned on and a plurality of signals to be written which are transmitted to the pair of said writing signal lines corresponding to said plurality of the comparing circuits are written into said plurality of selected memory cells. This provides an effect that updating of data when there is no data can be performed at a high speed while determination whether data which is same as input data has been stored can be made.

(4) Furthermore, said pairs of complementary bit lines and said pairs of complementary bit lines are provided with a precharging circuit, and a series of memory operation including the precharging operation in said precharging circuit in one period of the clock signal is performed. This provides an effect that a memory circuit having a high integration, which is stable even at a low voltage can be obtained.

(5) Furthermore, said pairs of writing signal lines and said pairs of reading signal lines are separately disposed at different wiring layer levels. This provides an effect that high integration of circuits and stable memory operation even at a low voltage can be achieved.

(6) Furthermore, said pairs of writing signal lines and said pairs of reading signal lines are configured so that the adjacent lines are disposed at the same wiring layer level to sandwich a shielding dummy wiring which is formed at said wiring layer level and is supplied with a constant voltage. This provides an effect that high integration of circuits and stable memory operation even at a low voltage can be achieved.

(7) Furthermore, one pair of signal lines of said pairs of complementary writing signal lines and said pairs of reading signal lines are disposed outside and the other pairs of signal lines are disposed inside, and there is provided such an intersection that said one pair of complementary signal lines which is disposed inside has a parasitic capacitance for both pairs of said outside complementary signal lines and the other pair of complementary signal lines which are disposed inside has a parasitic capacitance for both pairs of the outside complementary signal lines. Since interferences of changes in signals can be cancelled, there is provided an effect that high integration of circuits and stable memory operation even at a low voltage can be achieved.

(8) Furthermore, said pair of complementary signal lines which are provided inside and circuit elements which constitute said sense amplifier are disposed between said pairs of complementary reading signal lines. This provides an effect that circuit elements can be rationally disposed at a high density.

(9) Furthermore, said memory circuit is a tag memory which constitutes said cache memory. This provides an effect that a cache memory in which speeding up has been achieved can be implemented.

Although the invention which was made by present inventors has been described in detail with reference to the embodiments, it is to be understood that the present invention is not limited to the foregoing embodiments and that various alternations and modifications are possible without departing from the scope and spirit of the invention. For example, the shielding wiring conductors which are provided inside of the reading data lines rcdt, rcdb (close to the drain connecting wiring conductors of MOSFETs) may be omitted in FIG. 8. Numerals representative of wiring conductors width or wiring pitch in FIGS. 4, 7 to 8 are exemplarily shown and are appropriately preset depending upon the performance of circuit, and manufacturing techniques of the semiconductor integrated circuit. The present invention can be widely used in circuits, the operation of which is performed by comparing data stored in the memory circuit with input data to determine match or mismatch for writing input data in the memory circuit if mismatch is determined in addition to the address array in the cache tag or cache memory.

As mentioned above, a signal to be written is transmitted to said pairs of writing signal lines in parallel with address input operation for the selection of a word line which is connected to said memory cell, information stored in the memory cell selected in response to the selection operation of said word line is transmitted to said pair of reading signal lines via said second selecting switch circuit so that it is amplified by said sense amplifier, and the amplified output of said sense amplifier being compared with the signal to be written on said pair of writing signal lines so that the signal to be written which is transmitted to said pair of writing signal lines is written into said selected memory cell by selectively turning on said first selecting switch circuit in response to a result of said comparison. This achieves speeding up of the memory operation.

Said pairs of writing signal lines and said pairs of reading signal lines are separately disposed at different wiring layer levels. Said pairs of writing signal lines and said pairs of reading signal lines are configured so that the adjacent lines are disposed at the same wiring layer level to sandwich a shielding dummy wiring conductor which is formed at said wiring layer level and is supplied with a constant voltage. One pair of signal lines of said pairs of complementary writing signal lines and said pairs of reading signal lines are disposed outside and the other pairs of signal lines are disposed inside, and there is provided such an intersection that said one pair of complementary signal lines which is disposed inside has a parasitic capacitance for both pairs of said outside complementary signal lines and the other pair of complementary signal lines which are disposed inside has a parasitic capacitance for both pairs of the outside complementary signal lines. Such a circuit configuration cancels the interference between mutual signal changes, so that high integration of units and a stable memory operation even at low voltage can be achieved.

It should be further understood by those skilled in the art that the foregoing description has been made on embodiments of the invention and that various changes and modifications may be made in the invention without departing from the spirit of the invention and the scope of the appended claims.

What is claimed is:

1. A semiconductor integrated circuit device, characterized in that said device comprises a memory circuit including:

a plurality of word lines and plurality of pairs of complementary bit lines: a plurality of memory cells which are provided at the intersections between said plurality of word lines and said plurality of pairs of the bit lines;

a first select switch circuit for connecting said pairs of the complementary bit lines to pairs of complementary writing signal lines;

a second select switch circuit for connecting said pairs of complementary bit lines to pairs of complementary reading signal lines;

a sense amplifier including a latch circuit having an input and output coupled to one of said pairs of complementary reading signal lines, which is activated in response to an operation timing signal; and a comparing circuit for comparing the read signal which is amplified by said sense amplifier with a signal to be written which is transmitted to one of said pairs of complementary writing signal lines;

in which a signal to be written is transmitted to said one of said pairs of complementary writing signal lines in parallel with an address input operation for the selection of a word line which is connected to one of said memory cells;

information stored in the memory cell selected in response to the selection operation of said word line being transmitted to said pair of complementary reading signal lines via said second selecting switch circuit so that it is amplified by said sense amplifier; and the amplified output of said sense amplifier being compared with the signal to be written on said pair of complementary writing signal lines so that the signal to be written which is transmitted to said pair of complementary writing signal lines is written into said selected memory cell by selectively turning on said first selecting switch circuit in response to a result of said comparison.

2. A semiconductor integrated circuit device as defined in claim 1, in which two pairs of complementary bit lines are allocated to one pair of said complementary reading signal lines and a pair of said complementary writing signal lines, in which two of said second selecting switch circuits corresponding to said two pairs of complementary bit lines are configured so that one of said second select switch circuits corresponding to the non-selecting pair of the complementary bit lines before said word lines are selected is turned off and the other second select switch circuit corresponding to the selecting pair of complementary bit lines is turned on, and in which said sense amplifier is activated and the other second selecting switch circuit which has been turned on is turned off after information stored in the memory cell corresponding to the selecting pair of the complementary bit lines is read to the pair of reading signal lines via the other select switch circuit by the select operation of said word lines.

3. A semiconductor integrated circuit device as defined in claim 1, in which a plurality of said sense amplifiers and a plurality of said comparing circuits are provided and in which when any one of the output signals of the plurality of comparing circuits do not match, said first select switch circuit is turned on and a plurality of signals to be written which are transmitted to the pair of said writing signal lines corresponding to said plurality of the comparing circuits are written into said plurality of selected memory cells.

4. A semiconductor integrated circuit device as defined in claim 1, in which said pairs of complementary bit lines and said pairs of complementary bit lines are provided with a precharging circuit, and in which a series of memory operation including the precharging operation in said precharging circuit in one period of the clock signal is performed.

5. A semiconductor integrated circuit device as defined in claim 1, in which said pairs of complementary writing signal lines and said pairs of complementary reading signal lines are separately disposed at different wiring layer levels.

6. A semiconductor integrated circuit device as defined in claim 1, in which said pairs of complementary writing signal lines and said pairs of complementary reading signal lines are configured so that adjacent lines are disposed at the same wiring layer level to sandwich a shielding dummy wiring conductor which is formed at said wiring layer level and is supplied with a constant voltage.

7. A semiconductor integrated circuit device as defined in claim 1, in which complementary writing signal lines of said one of said pairs of complementary writing signal lines are respectively disposed outside of complementary reading signals lines of said one of said pairs of complementary reading signal lines relative to said latch circuit of said sense amplifier, and in which one complementary reading signal line of said pair of complementary reading signal lines which is disposed inside said pair of complementary writing signal lines has a parasitic capacitance for both of the complementary writing signal lines of said pair of said complementary writing signal lines and the other complementary reading signal line of said pair of complementary reading signal lines which is disposed inside of said complementary writing signal lines has a parasitic capacitance for both of the complementary writing signal lines of said pair of the outside complementary writing signal lines.

8. A semiconductor integrated circuit device as defined in claim 7, in which circuit elements which comprise said sense amplifier are disposed between said pairs of complementary reading signal lines which are located inside said pair of complementary writing signal lines.

9. A semiconductor integrated circuit device as defined in claim 1, in which said memory circuit is a tag memory which comprises a cache memory.

* * * * *

UNITED STATES PATENT AND TRADEMARK OFFICE
CERTIFICATE OF CORRECTION

PATENT NO. : 6,665,208 B2
DATED : December 16, 2003
INVENTOR(S) : K. Ogura et al.

It is certified that error appears in the above-identified patent and that said Letters Patent is hereby corrected as shown below:

Title page,
Item [73], Assignee, should read:
-- [73]  Assignee:  Renesas Technology Corp., Tokyo, (JP)
                   Hitachi ULSI Systems Co., Ltd., Tokyo, (JP) --

Signed and Sealed this

Thirteenth Day of April, 2004

JON W. DUDAS
*Acting Director of the United States Patent and Trademark Office*